US008571821B2

(12) United States Patent
Serra et al.

(10) Patent No.: US 8,571,821 B2
(45) Date of Patent: Oct. 29, 2013

(54) METHOD FOR DETERMINING THE CLOSING TIME OF AN ELECTROMAGNETIC FUEL INJECTOR

(75) Inventors: Gabriele Serra, San Lazzaro di Savena (IT); Marco Parotto, Bologna (IT); Saverio Armeni, Florence (IT); Luigi Santamato, Bologna (IT); Romito Tricarico, Ferrara (IT)

(73) Assignee: Magneti Marelli S.p.A., Corbetta (IT)

( * ) Notice: Subject to any disclaimer, the term of this patent is extended or adjusted under 35 U.S.C. 154(b) by 308 days.

(21) Appl. No.: 13/081,784

(22) Filed: Apr. 7, 2011

(65) Prior Publication Data

US 2011/0251808 A1 Oct. 13, 2011

(30) Foreign Application Priority Data

Apr. 7, 2010 (IT) .............................. BO2010A0207

(51) Int. Cl.
*G01R 19/00* (2006.01)

(52) U.S. Cl.
USPC ............................................ 702/64; 307/143

(58) Field of Classification Search
USPC ................................ 702/64, 79, 89, 125, 176
See application file for complete search history.

(56) References Cited

U.S. PATENT DOCUMENTS 5,345,916 A * 9/1994 Amann et al. ................ 123/506
5,747,684 A * 5/1998 Pace et al. .................. 73/114.49
6,142,121 A * 11/2000 Nishimura et al. ........... 123/456
2005/0279867 A1* 12/2005 Ismailov .................... 239/585.1
2007/0247126 A1* 10/2007 Xu et al. ....................... 323/266
2009/0112444 A1* 4/2009 Ishizuka et al. ............... 701/105
2009/0132180 A1* 5/2009 Pearce et al. .................... 702/38

FOREIGN PATENT DOCUMENTS

DE 10 2008 041 528 A1 3/2010
EP 0 559 136 A2 9/1993
WO 02/075139 A1 9/2002
WO 2005/066477 A1 7/2005

OTHER PUBLICATIONS

Nov. 17, 2010 Search Report for Italian Patent App. No. B02010A 000207.
Nov. 17, 2010 Search Report for Italian Patent App. No. B02010A 000208.

* cited by examiner

*Primary Examiner* — Jonathan C Teixeira Moffat
*Assistant Examiner* — Eman Alkafawi
(74) *Attorney, Agent, or Firm* — Howard & Howard Attorneys PLLC

(57) ABSTRACT

A method for determining the closing time of an electromagnetic fuel injector including the steps of applying at a starting time of the injection a positive voltage to the coil of the electromagnetic actuator in order to circulate through the coil an electric current which causes the opening of an injection valve; applying at an ending time of the injection a negative voltage to the coil in order to annul the electric current flowing through the coil; detecting the trend over time of the voltage across the coil after the annulment of the electric current flowing through the coil; identifying a perturbation of the voltage across the coil; and recognizing the closing time of the injector that coincides with the time of the perturbation of the voltage.

10 Claims, 10 Drawing Sheets

METHOD FOR DETERMINING THE CLOSING TIME OF AN ELECTROMAGNETIC FUEL INJECTOR

BACKGROUND OF THE INVENTION

1. Field of the Invention

The present invention relates to a method for determining the closing time of an electromagnetic fuel injector.

2. Description of the Related Art

An electromagnetic fuel injector of the type described, for example, in patent application EP1619384A2 may include a cylindrical tubular body having a central feeding channel, which performs the fuel conveying function, and ends with an injection nozzle regulated by an injection valve controlled by an electromagnetic actuator. The injection valve is provided with a pin, which is rigidly connected to a mobile keeper of the electromagnetic actuator to be displaced by the action of the electromagnetic actuator between a closed position and an open position of the injection nozzle against the bias of a closing spring. The spring pushes the pin into the closed position. The valve seat is defined by a sealing element, which is disc-shaped, inferiorly and fluid-tightly closes the central duct of the supporting body and is crossed by the injection nozzle. The electromagnetic actuator comprises a coil, which is arranged externally about the tubular body, and a fixed magnetic pole, which is made of ferromagnetic material and is arranged within the tubular body to magnetically attract the mobile keeper.

Normally, the injection valve is closed by effect of the closing spring which pushes the pin into the closed position. In the closed position, the pin presses against a valve seat of the injection valve and the mobile keeper is distanced from the fixed magnetic pole. In order to open the injection valve, i.e. to move the pin from the closed position to the open position, the coil of the electromagnetic actuator is energized to generate a magnetic field that attracts the mobile keeper towards the fixed magnetic pole against the elastic force exerted by the closing spring. The stroke of the mobile keeper stops when the mobile keeper itself strikes the fixed magnetic pole.

As shown in FIG. 3, the injection law (i.e. the law which binds the piloting time T to the quantity of injected fuel Q and is represented by the piloting time T/quantity of injected fuel Q curve) of an electromagnetic injector can be split into three zones: an initial no opening zone A, in which the piloting time T is too small and consequently the energy which is supplied to the coil of the electromagnet is not sufficient to overcome the force of the closing spring and the pin remains still in the closed position of the injection nozzle; a ballistic zone B, in which the pin moves from the closed position of the injection nozzle towards a complete opening position (in which the mobile keeper integral with the pin is arranged abutting against the fixed magnetic pole), but is unable to reach the complete opening position and consequently returns to the closed position before having reached the complete opening position; and a linear zone C, in which the pin moves from the closed position of the injection nozzle to the complete opening position, which is maintained for a given time.

The ballistic zone B is highly non-linear and, above all, has a high dispersion of the injection features from injector to injector. Consequently, the use of an electromagnetic injector in ballistic zone B is highly problematic, because it is impossible to determine the piloting time T needed to inject a quantity of desired fuel Q with sufficient accuracy.

A currently marketed electromagnetic fuel injector cannot normally be used for injecting a quantity of fuel lower than approximately 10% of the maximum quantity of fuel which can be injected in a single injection with sufficient accuracy. Thus, 10% of the maximum quantity of fuel which can be injected in a single injection is the limit between ballistic zone B and linear zone C. However, the manufacturers of controlled ignition internal combustion engines (i.e. engines that work according to the Otto cycle) require electromagnetic fuel injectors capable of injecting considerably lower quantities of fuel, in the order of 1 milligram, with sufficient accuracy. This requirement is due to the observation that the generation of polluting substances during combustion can be reduced by fractioning fuel injection into several distinct injections. Consequently, an electromagnetic fuel injector must also be used in ballistic zone B because only in the ballistic zone B can injected quantities of fuel be in the order of 1 milligram.

The high dispersion of injection features in ballistic zone B from injector to injector is mainly related to the dispersion of the thickness of the gap existing between the mobile keeper and the fixed magnetic pole of the electromagnet. However, in light of the fact that minor variations to the thickness of the gap have a considerable impact on injection features in ballistic zone B, it is very complex and consequently extremely costly to reduce dispersion of injection features in ballistic zone B by reducing the dispersion of gap thickness.

The matter is further complicated by the aging phenomena of a fuel injector which can result in a creep of injection features over time.

Published patent applications WO2010023104A1 and WO2002075139A1 describe a piloting method of an electromagnetic fuel injector which, among other matters, contemplates determining the closing time of the injector by detecting the trend over time of the voltage across a coil of an electromagnetic actuator after the annulment of the electric current circulating through the coil and by consequently identifying a perturbation of the voltage across the coil after the annulment of the electric current circulating through the coil.

SUMMARY OF THE INVENTION

It is an object of the present invention to provide a method for determining the closing time of an electromagnetic fuel injector, which is free from the above-described drawbacks and, in particular, is easy and cost-effective to implement.

Accordingly, the present invention is directed toward a method for determining the closing time of an electromagnetic fuel injector including the steps of applying at a starting time of the injection a positive voltage to the coil of the electromagnetic actuator in order to circulate through the coil an electric current which causes the opening of an injection valve; applying at an ending time of the injection a negative voltage to the coil in order to annul the electric current flowing through the coil; detecting the trend over time of the voltage across the coil after the annulment of the electric current flowing through the coil; identifying a perturbation of the voltage across the coil; and recognizing the closing time of the injector that coincides with the time of the perturbation of the voltage.

BRIEF DESCRIPTION OF THE DRAWINGS

Other objects, features and advantages of the present invention will be readily appreciated as the same becomes better understood after reading the subsequent description taken in connection with the accompanying drawings wherein.

DETAILED DESCRIPTION OF THE PREFERRED EMBODIMENT(S)

Figure 1:
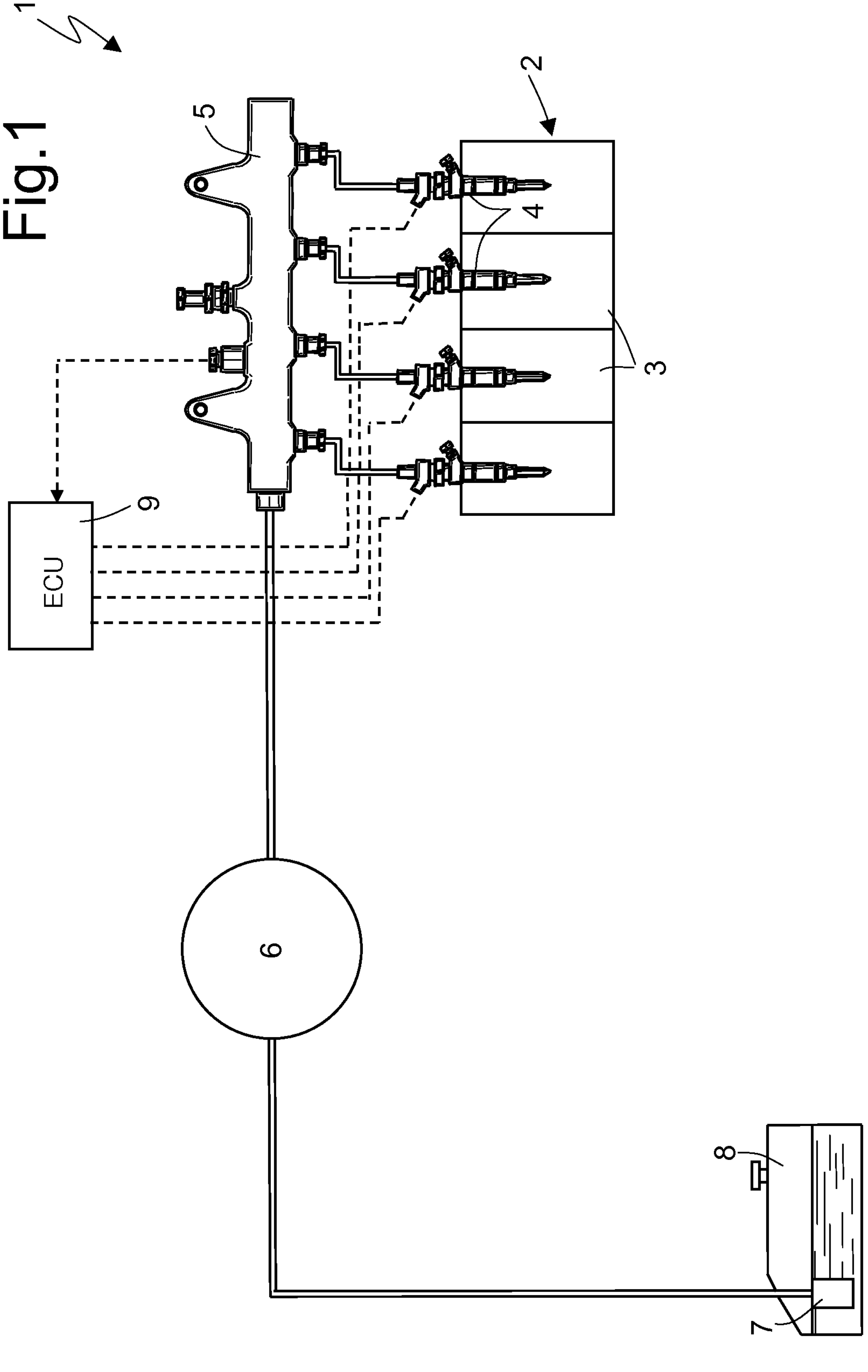
FIG. 1 is a schematic view of a common-rail type injection system which implements the method of this invention.

In FIG. 1, numeral 1 indicates as a whole an injection assembly of the common-rail type system for the direct injection of fuel into an internal combustion engine 2 provided with four cylinders 3. The representative injection system 1 includes four electromagnetic fuel injectors 4, each of which injects fuel directly into a respective cylinder 3 of the engine 2 and receives pressurized fuel from a common rail 5. The injection system 1 comprises a high-pressure pump 6 which feeds fuel to the common rail 5 and is actuated directly by a driving shaft 2 of the engine by means of a mechanical transmission, the actuation frequency of which is directly proportional to the revolution speed of the driving shaft. In turn, the high-pressure pump 6 is fed by a low-pressure pump 7 arranged within the fuel tank 8. Each injector 4 injects a variable quantity of fuel into the corresponding cylinder 3 under the control of an electronic control unit 9.

Figure 2:
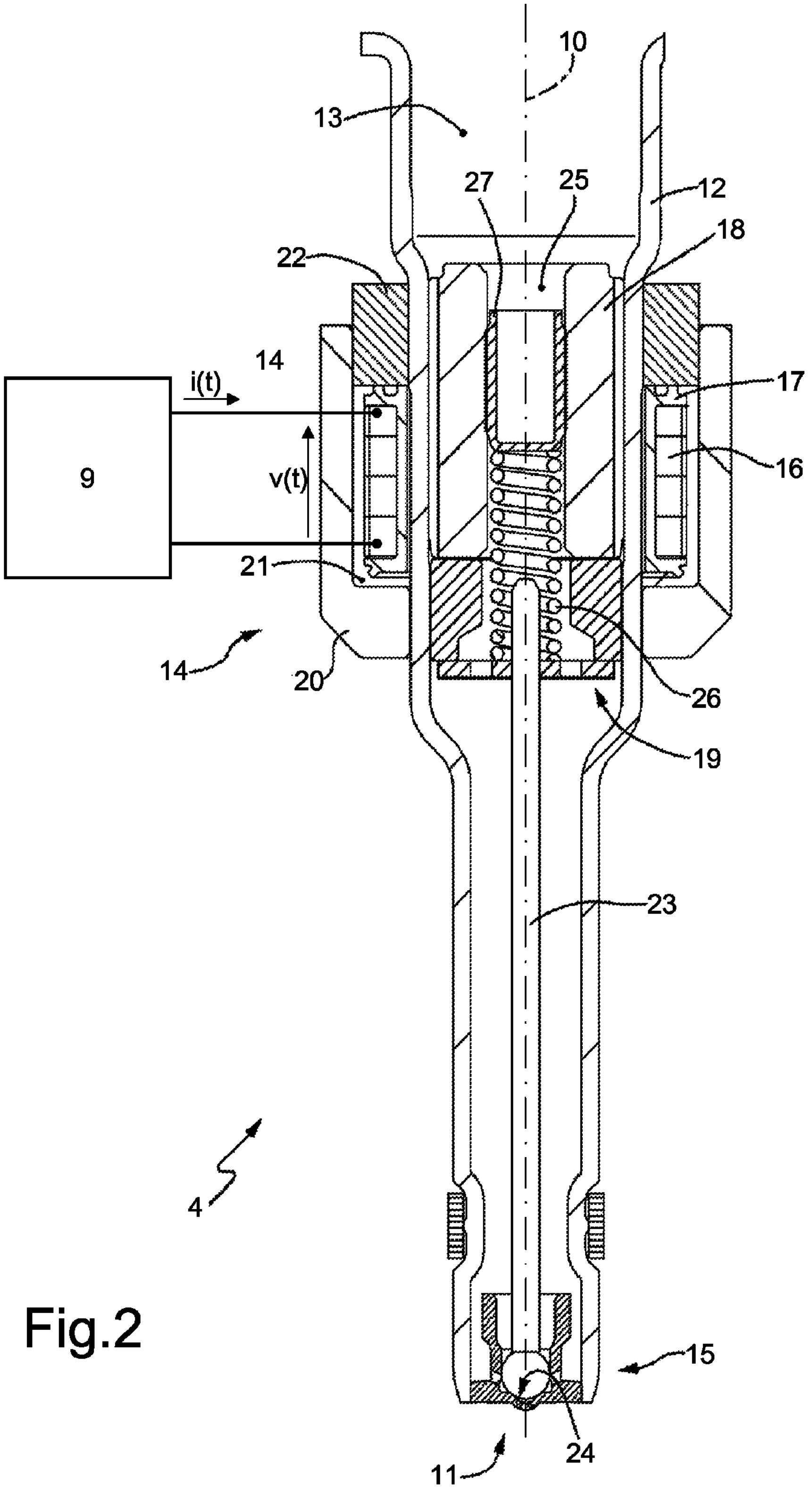
FIG. 2 is a schematic, side elevation and section view of an electromagnetic fuel injector of the injection system in FIG. 1.

As shown in FIG. 2, each representative fuel injector 4 substantially has a cylindrical symmetry about a longitudinal axis 10 and is controlled to inject fuel from an injection nozzle 11. The injector 4 comprises a supporting body 12, which has a variable section cylindrical tubular shape along longitudinal axis 10, and a feeding duct 13 extending along the entire length of supporting body 12 itself to feed pressurized fuel towards injection nozzle 11. The supporting body 12 supports an electromagnetic actuator 14 at an upper portion thereof and an injection valve 15 at a lower portion thereof, which valve inferiorly delimits the feeding duct 13. In its operative mode, the injection valve 15 is actuated by the electromagnetic actuator 14 to regulate the fuel flow through the injection nozzle 11, which forms a part of the injection valve 15 itself.

The electromagnetic actuator 14 comprises a coil 16, which is arranged externally around tubular body 12 and is enclosed in a plastic material toroidal case 17. A fixed magnetic pole 18 (also called "bottom") is formed by ferromagnetic material and is arranged within the tubular body 12 at the coil 16. Furthermore, the electromagnetic actuator 15 includes a mobile keeper 19 which has a cylindrical shape, is made of ferromagnetic material and is adapted to be magnetically attracted by magnetic pole 18 when coil 16 is energized (i.e. when current flows through it). Finally, the electromagnetic actuator 15 includes a tubular magnetic casing 20 which is made of ferromagnetic material, is arranged outside the tubular body 12 and includes an annular seat 21 for accommodating the coil 16 therein, and a ring-shaped magnetic washer 22 which is made of ferromagnetic material and is arranged over the coil 16 to guide the closing of the magnetic flux about the coil 16 itself.

The mobile keeper 19 is part of a mobile plunger, which further includes a shutter or pin 23 having an upper portion that may be formed integral with the mobile keeper 19 and a lower portion cooperating with a valve seat 24 of the injection valve 15 to adjust the fuel flow through the injection nozzle 11 in the known manner. In particular, the pin 23 ends with a substantially spherical shutter head which is adapted to fluid-tightly rest against the valve seat.

The magnetic pole 18 is centrally perforated and has a central through hole 25, in which the closing spring 26 which pushes the mobile keeper 19 towards a closing position of the injection valve 15 is partially accommodated. In particular, a reference body 27, which maintains the closing spring 26 compressed against the mobile keeper 19 within the central hole 25 of the magnetic pole 18, is piloted in fixed position.

In operation, when the electromagnetic actuator 14 is de-energized, the mobile keeper 19 is not attracted by the magnetic pole 18 and the elastic force of the closing spring 26 pushes the mobile keeper 19 downwards along with the pin 23 (i.e. the mobile plunger) to a lower limit position in which the shutter head of the pin 23 is pressed against the valve seat 24 of the injection valve 15, isolating the injection nozzle 11 from the pressurized fuel. When the electromagnetic actuator 14 is energized, the mobile keeper 19 is magnetically attracted by the magnetic pole 18 against the elastic bias of the closing spring 26 and the mobile keeper 19 along with pin 23 (i.e. the mobile plunger) is moved upwards by effect of the magnetic attraction exerted by the magnetic pole 18 itself to an upper limit position, in which the mobile keeper 19 abuts against the magnetic pole 18 and the shutter head of the pin 23 is raised with respect to the valve seat 24 of the injection valve 15, allowing the pressurized fuel to flow through the injection nozzle 11.

As shown in FIG. 2, the coil 16 of the electromagnetic actuator 14 of each fuel injector 4 is fed to the electronic control unit 9 which applies a voltage v(t) variable over time to the electronic control unit 9, which determines the circulation through the coil 16 of a current i(t) variable over time.

Figure 3:
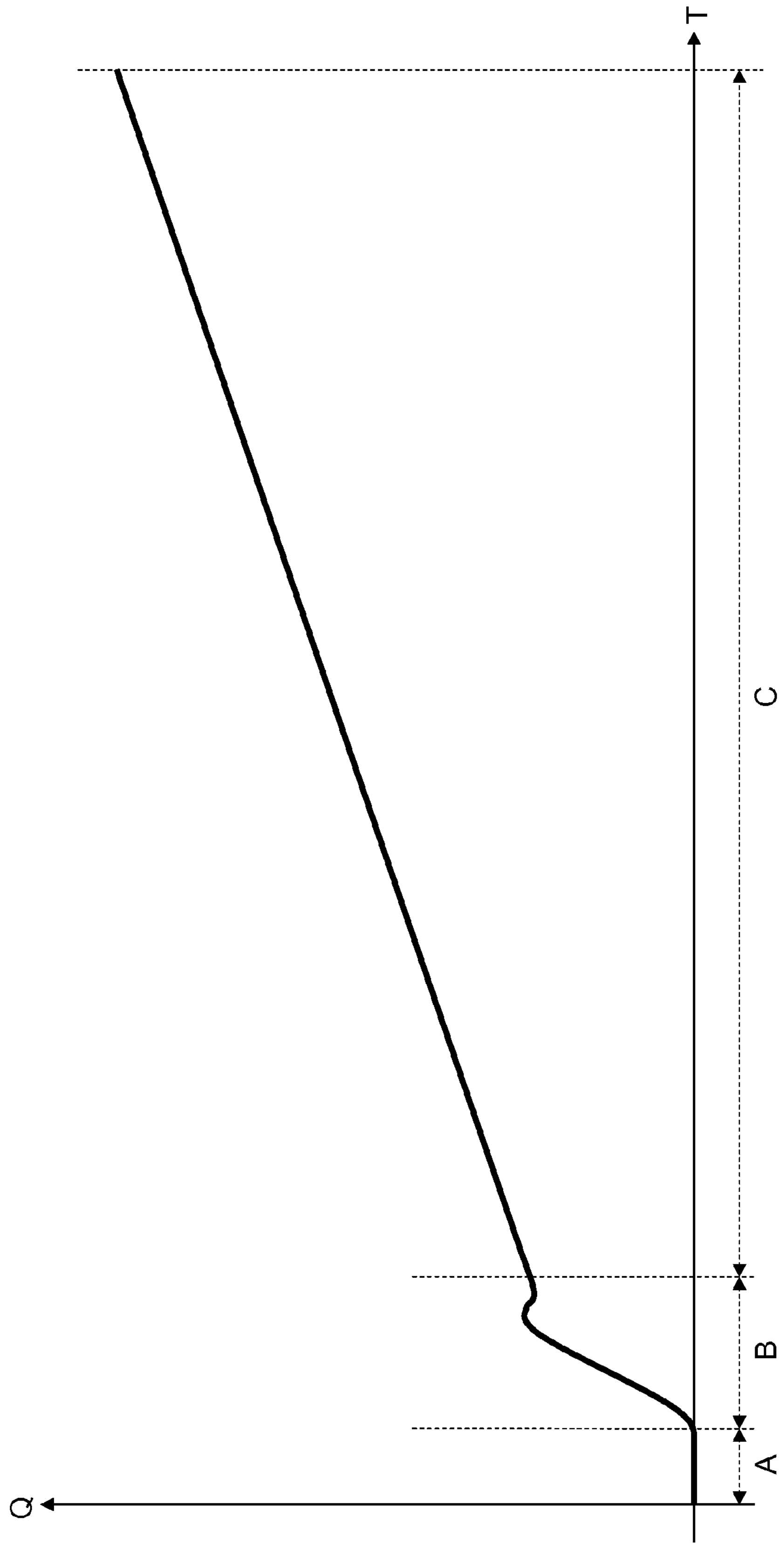
FIG. 3 is a graph illustrating the injection feature of an electromagnetic fuel injector of the injection system in FIG. 1.

As shown in FIG. 3, the injection law (i.e. the law which binds the piloting time T to the quantity of injected fuel Q and is represented by the piloting time T/quantity of injected fuel Q curve) in each fuel injector 4 can be split into three zones: an initial no opening zone A, in which the piloting time T is too small and consequently the energy supplied to the coil 16 of the electromagnetic actuator 14 is not sufficient to overcome the force of the closing spring 26 and pin 23 remains still in the closed position of the injection valve 15; a ballistic zone B, in which pin 23 moves from the closed position of the injection valve 15 towards a complete opening position (in which the mobile keeper 19 integral with pin 23 is arranged abutting against the fixed magnetic pole 18), but cannot reach the complete opening position and consequently returns to the closed position before having reached the complete opening position; and a linear zone C, in which pin 23 moves from the closed position of the injection valve 15 to the complete opening position which is maintained for a given time.

Figure 4:
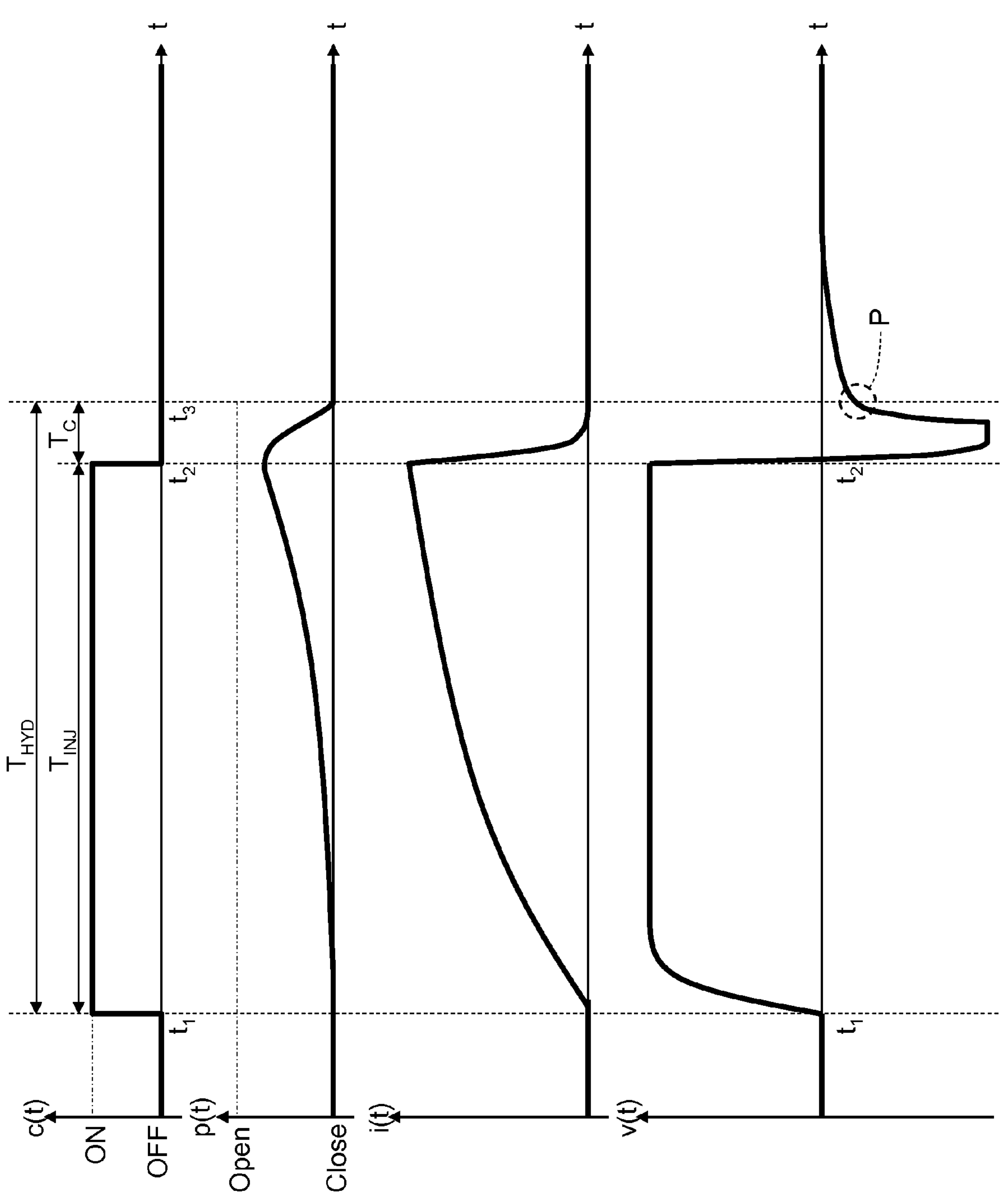
FIG. 4 is a graph illustrating the evolution over time of some physical magnitudes of an electromagnetic fuel injector of the injection system in FIG. 1 which is controlled to inject fuel in a ballistic zone of operation.

The chart in FIG. 4 shows the evolution of some physical magnitudes over time of a fuel injector 4 which is controlled to inject fuel in ballistic operating zone B. In other words, injection time $T_{INJ}$ is short (in the order of 0.1-0.2 ms) and thus by effect of the electromagnetic attraction generated by the electromagnetic actuator 14 pin 23 (along with the mobile keeper 19) moves from the closed position of the injection valve 15 towards a complete opening position (in which the mobile keeper 19 integral with pin 23 is arranged to abut against the magnetic fixed pole 18), which is not in all cases reached because the electromagnetic actuator 14 is turned off before pin 23 (along with the mobile keeper 19) reaches the complete opening position of the injection valve 15. Consequently, when the pin 23 is still "on the fly" (i.e. in an intermediate position between the closed position and the complete opened position of the injection valve 15) and is moving towards the complete opened position, the electromagnetic actuator 14 is turned off and the thrust generated by the closing spring 26 interrupts the movement of pin 23 towards the complete opening position of the injection valve 15, and thus moves pin 23 in opposite sense to take pin 23 to the initial closed position of the injection valve 15.

As shown in FIG. 4, the logical piloting control c(t) of the injector 4 contemplates opening the injector in a time $t_1$ (switching of logical piloting control c(t) from the off state to the on state) and the closing of the injector in a time $t_2$ (switching of logical piloting control c(t) from the on state to the off state). The injection time $T_{INJ}$ is equal to the interval of time elapsing between times $t_1$ and $t_2$ and is short. Consequently, the fuel injector 4 operates in the ballistic operating zone B.

In time $t_1$ the coil 16 of the electromagnetic actuator 14 is energized and consequently starts producing a motive force which opposes the force of the closing spring 26. When the motive force generated by the coil 16 of the electromagnetic actuator 14 exceeds the force of the closing spring 26, the position p(t) of pin 23 (which is integral with the mobile keeper 19) starts to vary from the closing position of the injection valve 15 (indicated with the word "Close" in FIG. 4) to the complete opened position of the injection valve 15 (indicated with the word "Open" in FIG. 4). In time $t_2$, the position p(t) of pin 23 has not yet reached the complete opened position of the injection valve 15 and by effect of the ending of the logical piloting control c(t) of the injector 4 the injection valve 15 is returned to the closed position, which is reached in time $t_3$ (i.e. when the shutter head of the pin 23 tightly rests against the valve seat of the injection valve 15). The interval of time which elapses between times $t_2$ and $t_3$, i.e. the interval of time which elapses between the end of the logical piloting control c(t) of the injector 4 and the closing of the injector 4, is called closing time $T_C$.

In time $t_1$, voltage v(t) applied to the ends of the coil 16 of the electromagnetic actuator 14 of the injector 4 is increased to reach a positive ignition peak which is used to make the current i(t) across the coil 16 rapidly increase. At the end of the ignition peak, voltage v(t) applied to the ends of the coil 16 is controlled according to the "chopper" technique which contemplates cylindrically varying voltage v(t) between a positive value and a zero value to maintain the current i(t) in a neighborhood of a desired maintenance value. In time $t_2$, voltage v(t) applied across the coil 16 is made to rapidly decrease to reach a negative off peak, which is used to rapidly annul current i(t) across the coil 16. Once current i(t) has been annulled, the residual voltage v(t) is discharged exponentially until annulment and during this step of annulment of voltage v(t) injector 4 closes (i.e. is time $t_3$ in which the pin 23 reaches the closed position of the injection valve 15). Indeed, pin 23 starts the closing stroke towards the closed position of the injection valve 15 only when the force of the closing spring 26 overcomes the electromagnetic attraction force which is generated by the electromagnetic actuator 14 and is proportional to current i(t), i.e. is annulled when current i(t) is annulled.

The method used to determine the closing time $t_3$ of the electromagnetic fuel injector 4 is described below.

As previously mentioned with regards to FIG. 4, in the starting time $t_1$ of the injection, a positive voltage v(t) is applied to coil 16 of the electromagnetic actuator 14 to make an electric current i(t) circulate through the coil 16 of the injection valve, which determines the opening of the injection valve 15, and, in an ending time $t_2$ of the injection, a negative voltage v(t) is applied to coil 16 of the electromagnetic actuator 14 to annul the electric current i(t) which circulates through the coil 16.

Figure 5:
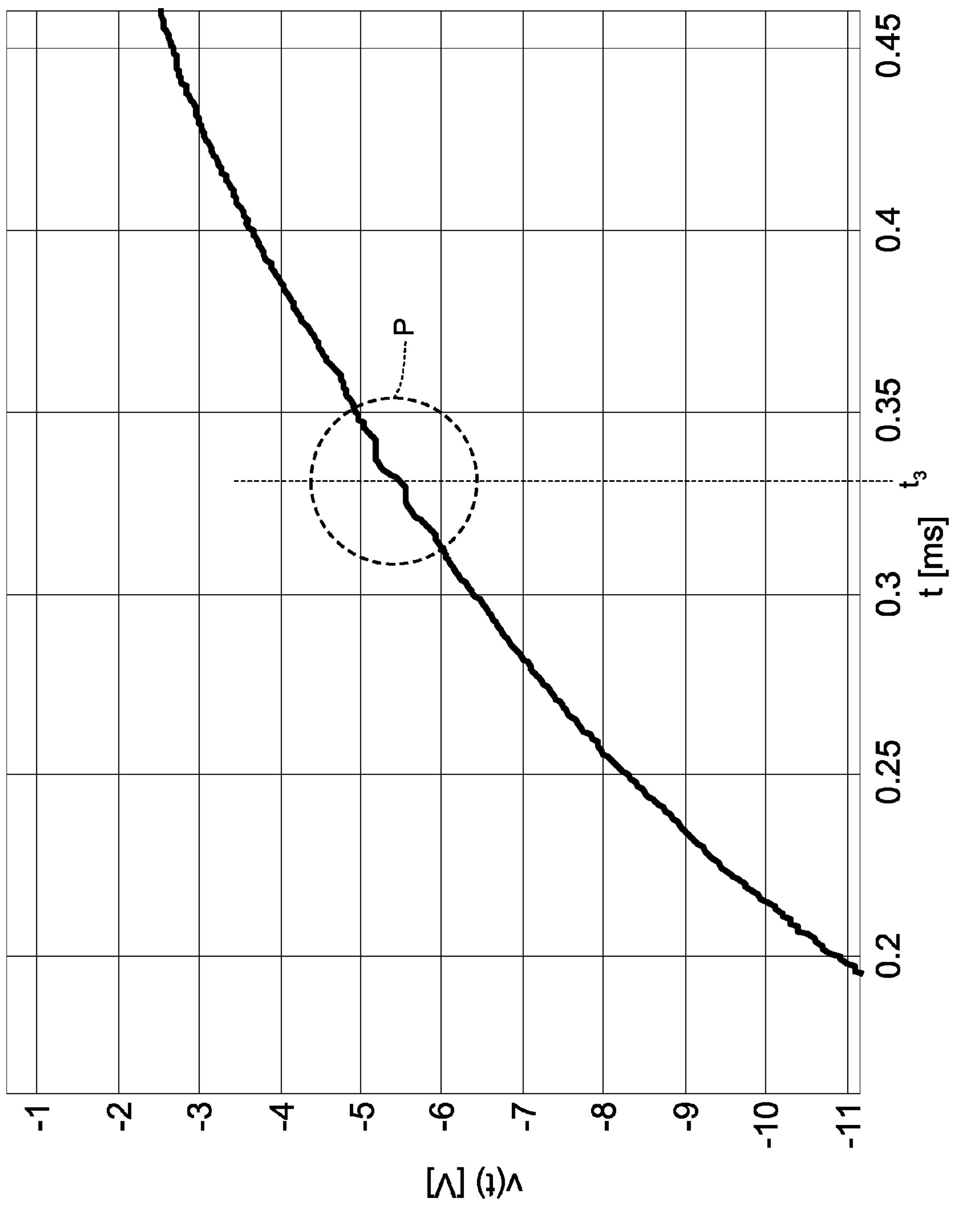
FIG. 5 is a graph illustrating an enlarged scale view of a detail of the evolution over time of the electric voltage across a coil of an electromagnetic fuel injector of the injection system in FIG. 1.

As shown in FIG. 5, at the end of injection (i.e. after ending time $t_2$ of injection), the control unit 9 detects the trend over time of voltage v(t) across the coil 16 of the electromagnetic actuator 14 after annulment of the electric current i(t) circulating through the coil 16 and until annulment of voltage v(t) itself. Furthermore, the electronic control unit 9 identifies a perturbation P of voltage v(t) across the coil 16 (constituted by a high frequency oscillation of voltage v(t) across the coil 16) after annulment of the electric current i(t) circulating through the coil 16. Typically, perturbation P of voltage v(t) across the coil 16 has a frequency comprised in a neighborhood of 70 kHz. Finally, the electronic control unit recognizes the closing time $t_3$ of the injector 4 which coincides with time $t_3$ of the perturbation P of voltage v(t) across the coil (16) after the annulment of the electric current i(t) which circulates through the coil 16. In other words, the electronic control unit 9 assumes that injector 4 closes when perturbation P of voltage v(t) across the coil (16) occurs after annulment of the electric current i(t) circulating through the coil 16. This assumption is based on the fact that when the shutter head of pin 23 impacts against the valve seat of the injection valve 15 (i.e. when the injector 4 closes), the mobile keeper 19, which is integral with pin 23, very rapidly modifies its law of motion (i.e. it nearly timely goes from a relatively high speed to a zero speed), and such a substantially pulse-like change of the law of motion of the mobile keeper 19 produces a perturbation in the magnetic field which concatenates with the coil 16, and thus also determines perturbation P of voltage v(t) across the coil 16.

Figures 6A, 6B, 6C, 6D:
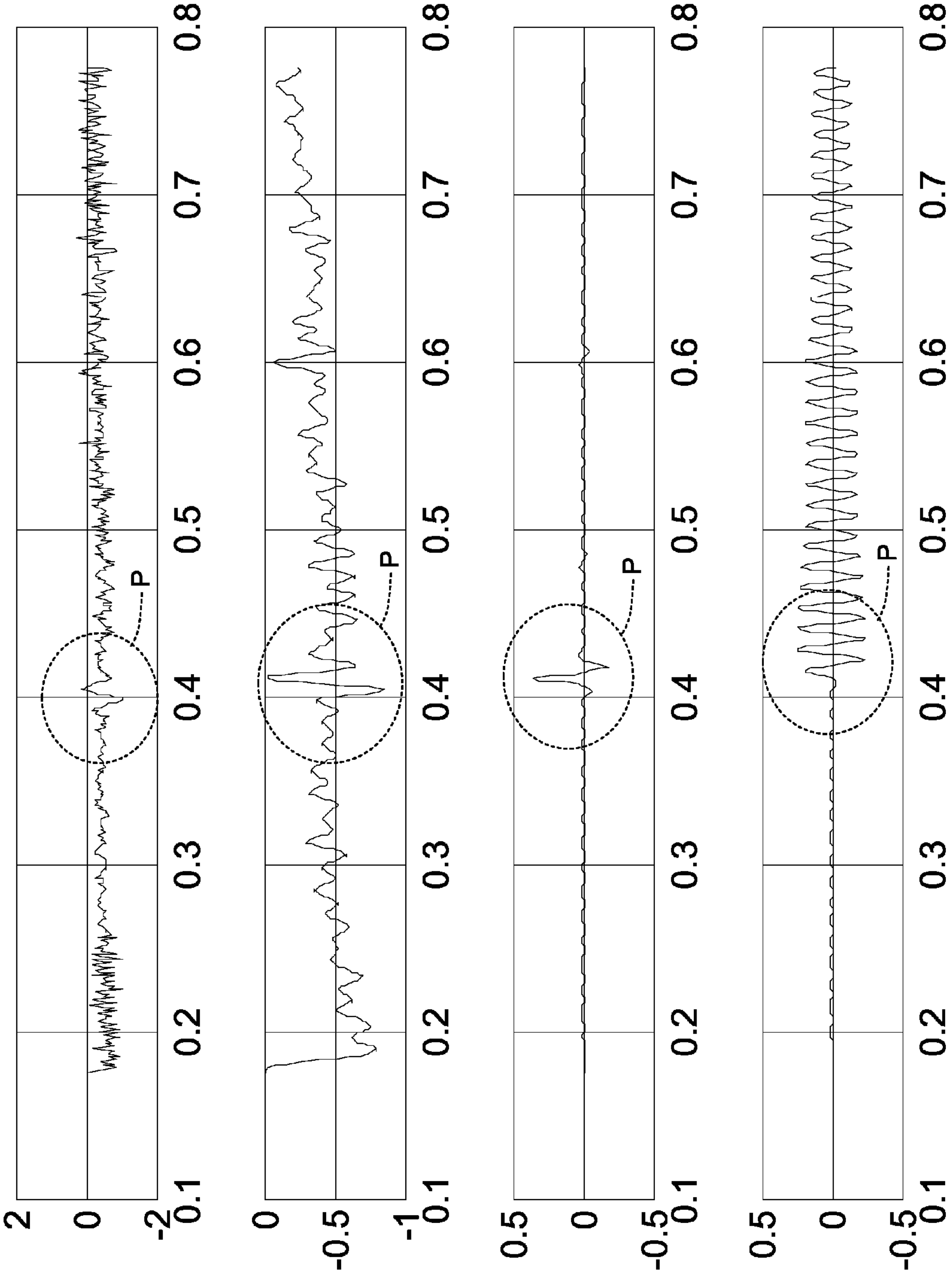
FIGS. 6-9 are graphs illustrating the evolution over time of same signals obtained from mathematical processing of the electric voltage across a coil of an electromagnetic fuel injector in FIG. 5.

According to one embodiment, the first derivative in time of voltage v(t) across the coil 16 after the annulment of the electric current i(t) circulating through the coil (16) is calculated in order to identify perturbation P. FIG. 6*a* shows the first derivative in time of voltage v(t) across the coil 16, shown in FIG. 5. Subsequently, the first derivative in time is filtered by means of a band-pass filter which includes a low-pass filter and a high-pass filter. FIG. 6*b* shows the first derivative in time of voltage v(t) across the coil 16 after processing by means of the low-pass filter. FIG. 6*c* shows the first derivative in time of voltage v(t) across the coil 16 after processing by means of a further optimized low-pass filter, and FIG. 6*b* shows the first derivative in time of voltage v(t) across the coil 16 after processing by means of the high-pass filter. Generally, the band-pass filter used for filtering the first derivative in time has a pass band in the range from 60 to 110 kHz.

Figure 7B:
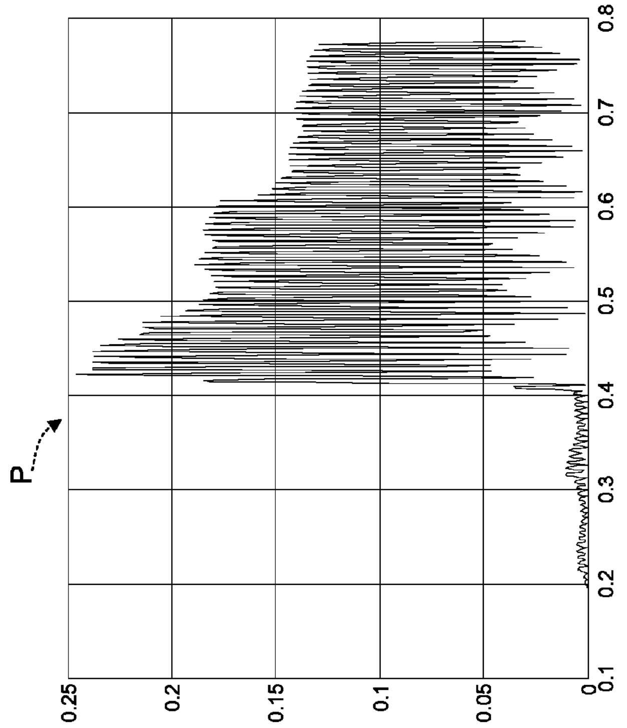
Figure 7A:
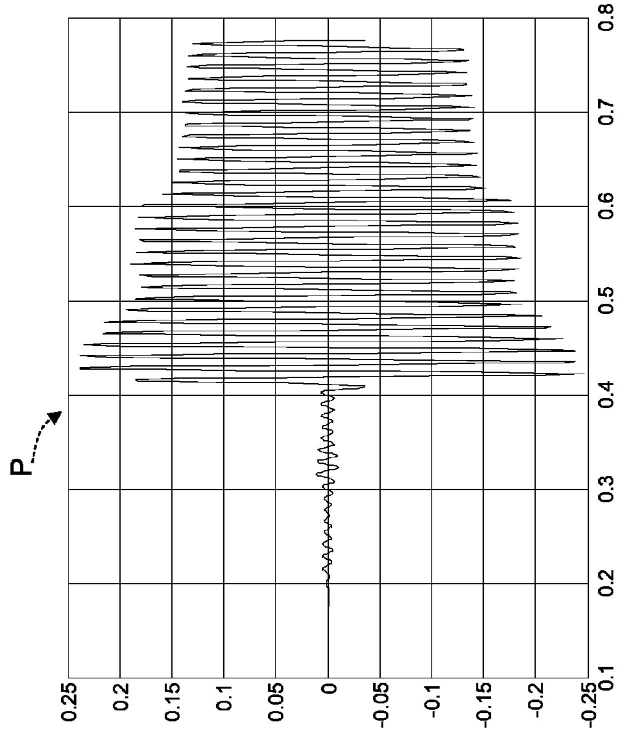

At the end of the filtering processes described above, the filtered first derivative in time of voltage v(t) across the coil 16 (also shown in FIG. 7*a* on enlarged scale with respect to FIG. 6*d*) is always made positive by calculating the absolute value thereof. FIG. 7*b* shows the absolute value of the filtered first derivative in time of voltage v(t) across the coil 16.

Figure 8B:
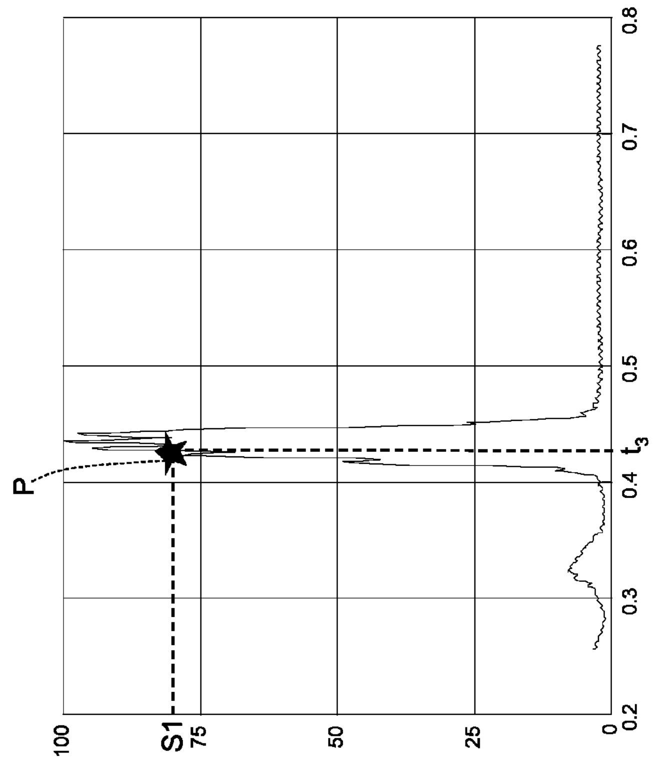
Figure 8A:
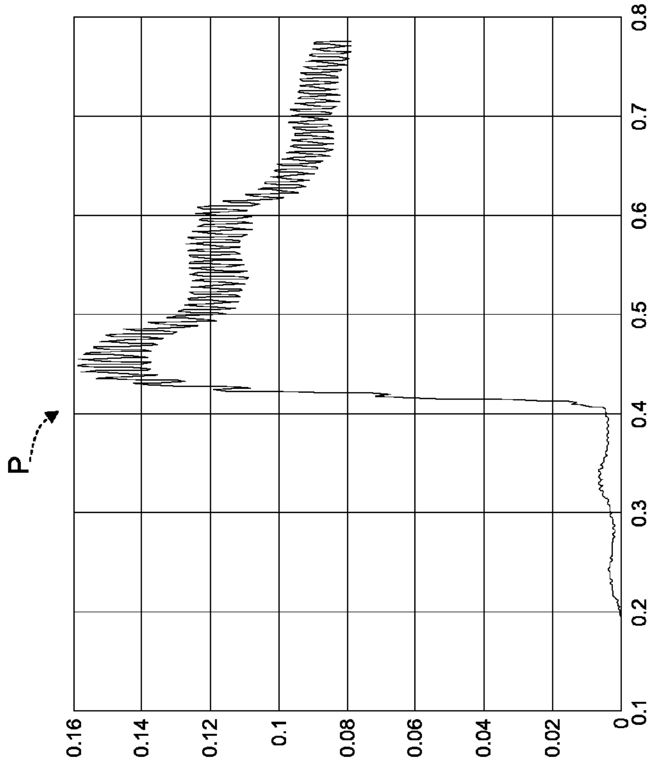

In one embodiment, before identifying perturbation P, the absolute value of the filtered first derivative in time of voltage v(t) across the coil 16 is further filtered by applying a moving average (which constitutes a band-pass filter). In other words, before identifying perturbation P, a moving average is applied to the filtered first derivative in time of voltage v(t) across the coil 16. FIG. 8*a* shows the result of the application of the moving average to the absolute value of the filtered first derivative in time of voltage v(t) across the coil 16.

In one embodiment, before identifying perturbation P and after having applied the moving average, the absolute value of the filtered first derivative in time of voltage v(t) across the coil 16 may be normalized so that after normalization the absolute value of the filtered first derivative in time of the voltage v(t) across the coil 16 varies within a standard predefined interval. In other words, normalization consists in dividing (or multiplying) the absolute value of the filtered first derivative in time by the same factor so that after normalization the absolute value of the filtered first derivative in time is contained within a standard predefined range (e.g. from 0 to 100). This is illustrated in FIG. 8*b*, which shows the normalized absolute value of the filtered first derivative in time. The normalized absolute value of the filtered first derivative in time varies from a minimum of about 0 to a maximum of 100 (i.e. varies within the standard predefined 0-100 range).

According to a one possible embodiment, perturbation P is identified when the normalized absolute value of the filtered first derivative in time of the voltage v(t) across the coil 16 exceeds a predetermined threshold value S1. For example, as shown in FIG. 8*b*, perturbation P (which occurs in closing time $t_3$) is identified when the normalized absolute value of the filtered first derivative in time exceeds the threshold value S1.

Figure 9:
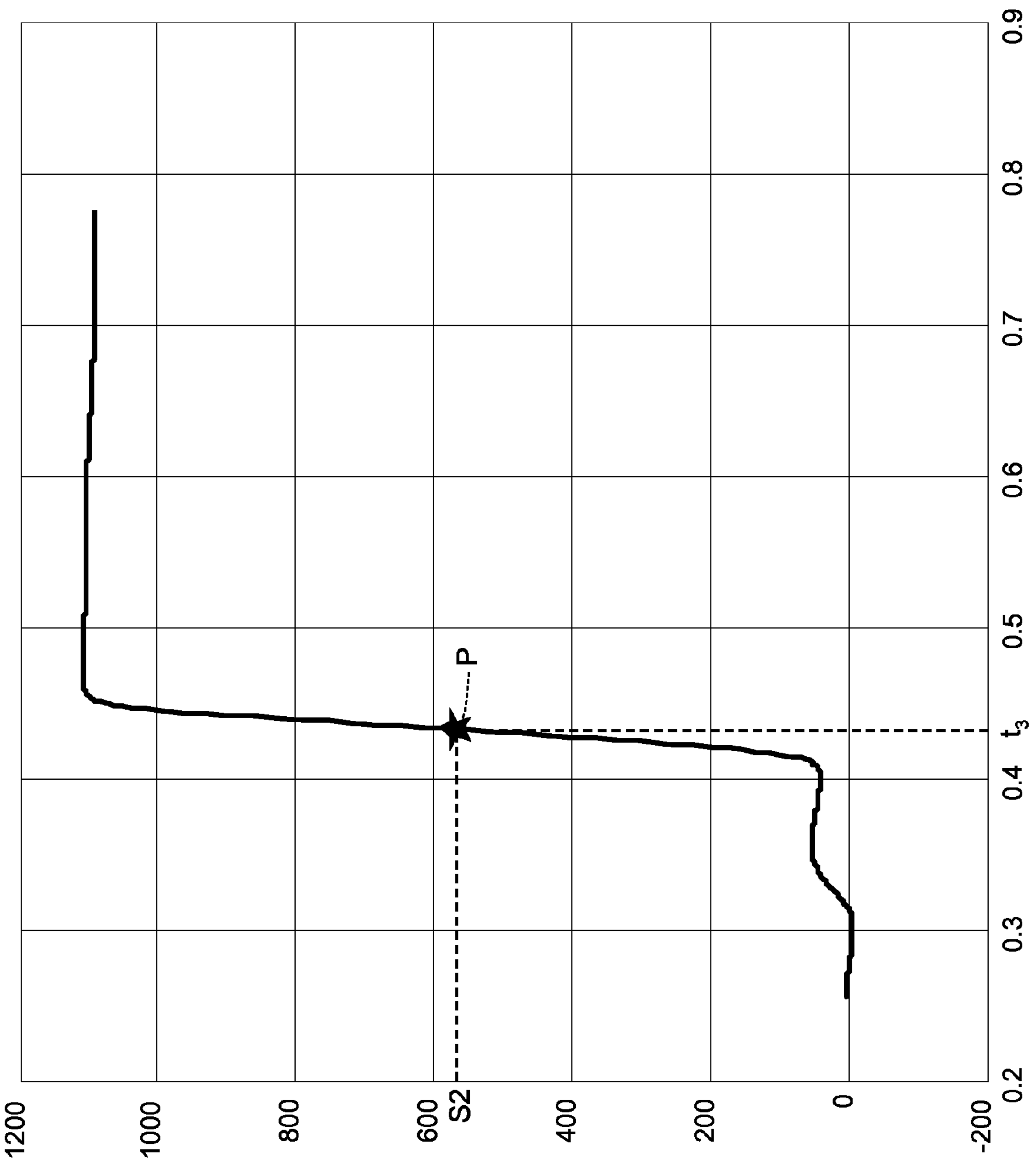

According to another possible embodiment, an integral over time of the normalized absolute value of the filtered first derivative in time of the voltage v(t) across the coil 16 is calculated and the perturbation P is identified when such integral over time of the normalized absolute value of the filtered first derivative in time exceeds a second predetermined threshold value S2. For example, as shown in FIG. 9, perturbation P (which identifies the closing time $t_3$) is identified in the time in which the normalized absolute value of the filtered first derivative in time exceeds the threshold value S2.

Threshold values S1 and S2 are constant because the filtered first derivative in time of the voltage v(t) across the coil 16 was preventively normalized (i.e. conducted back within a standard, predefined variation range). In the absence of preventive normalization of the absolute value of the filtered first derivative in time of the voltage v(t) across the coil 16, the threshold values S1 and S2 must be calculated as a function of the maximum value reached by the filtered first derivative in time (e.g. could be equal to 50% of the maximum value reached by the absolute value of the filtered first derivative in time).

According to one embodiment, a predefined time advance is applied in time $t_3$ of perturbation P determined as described above is applied which compensates for the phase delays introduced by all filtering processes to which filtered first derivative in time of the voltage v(t) across the coil 16 is subjected to identify the perturbation P. In other words, time $t_3$ of the perturbation P determined as described above is advanced by means of a predefined interval of time to account for phase delays introduced by all filtering processes to which the voltage v(t) across the coil 16 is subjected.

It is worth noting that the method described above for determining the time of closing $t_3$ of the injector 4 is valid in any condition of operation of the injector 4. Thus, the method may be employed both when the injector 4 is operating in ballistic zone B, in which in ending time $t_2$ of the injection the pin 23 has not yet reached the complete opening position of the injection valve 15, and when the injector 4 is operating in linear zone C, in which in the ending time $t_2$ of injection the pin 23 reaches the complete opening position of the injection valve 15. However, knowing the closing time $t_3$ of the injector 4 is particularly useful when the injector 4 is operating in ballistic zone B, in which the injection feature of the injector 4 is highly non-linear and dispersed, while it is generally not very useful when the injector 4 is operating in linear zone C, in which the injection feature of the linear injector 4 is not very dispersed.

Figure 10:
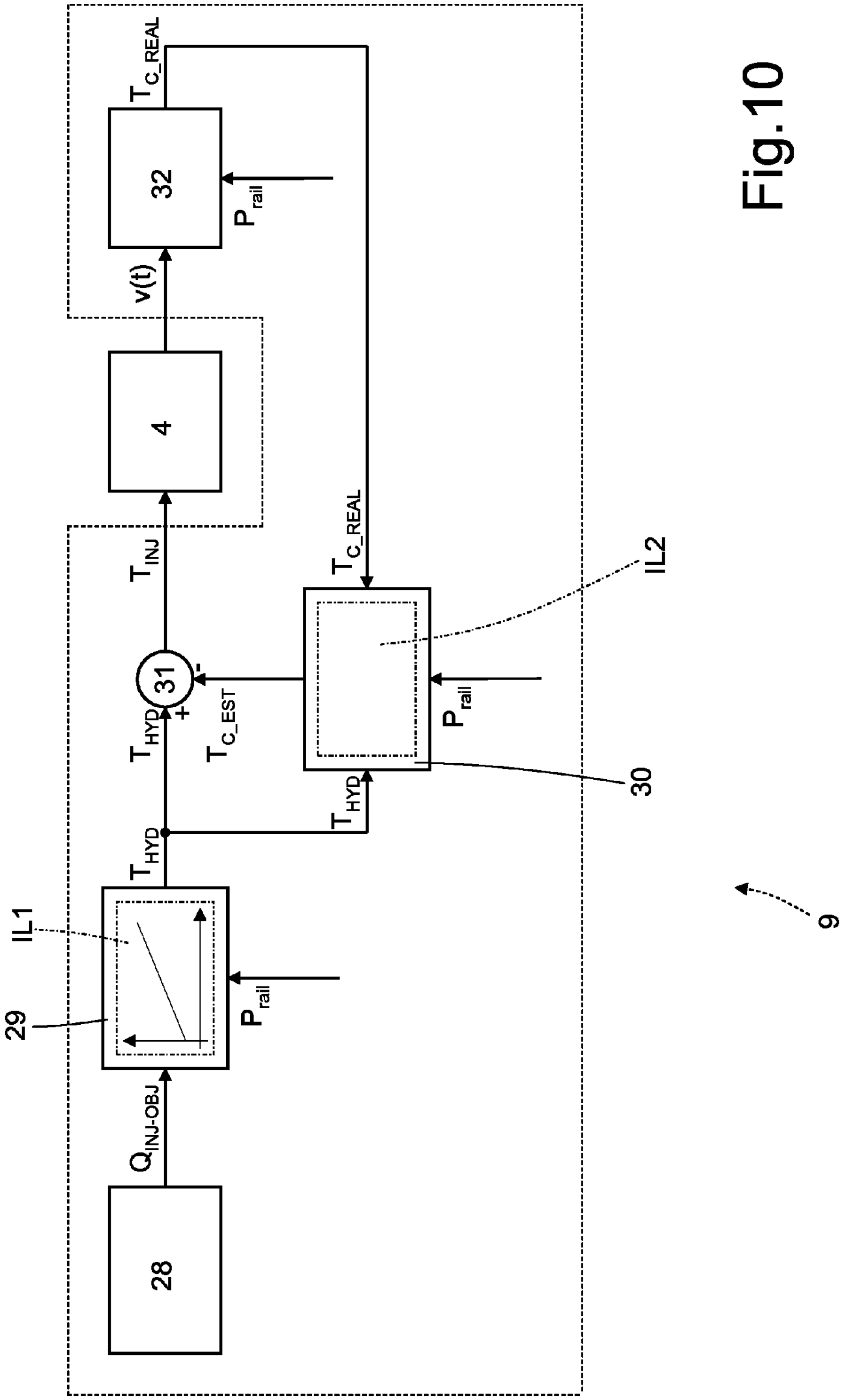
FIG. 10 is a block diagram of a control logic implemented in a control unit of the injection system in FIG. 1.

A control method of an injector 4, which is used by the electronic control unit 9 at least when the injector 4 itself works in ballistic working zone B, is described below with reference to block chart in FIG. 10.

During a step of designing and tuning, a first injection law IL1 is experimentally determined, which provides the hydraulic supply time $T_{HYD}$ as a function of the target quantity $Q_{INJ-OBJ}$ of fuel to inject. The first hydraulic supply time $T_{HYD}$ is equal to the sum of the injection time $T_{INJ}$ (equal, in turn, to the time elapsing between the starting time $t_1$ of injection and the ending time $t_2$ of injection) and the closing time $T_C$ (equal, in turn, the time interval elapsing between ending time $t_2$ of the injection and the closing time $t_3$ of the injector 4).

Furthermore, during the step of designing and tuning a second injection law IL2 which provides the closing time $T_{C\_EST}$ estimated as a function of the hydraulic supply time $T_{HYD}$, is determined.

Initially (i.e. before fuel injection), a calculation block 28 determines a target quantity $Q_{INJ-OBJ}$ of fuel to inject, which represents how much the fuel must be injected by the injector 4 during the step of injection. The objective of the electronic control unit 9 is to pilot the injector 4 so that the quantity of fuel $Q_{INJ-REAL}$ really injected is as close as possible to the target quantity $Q_{INJ-OBJ}$ of fuel to inject.

The target quantity of fuel $Q_{INJ-OBJ}$ to inject is communicated to a calculation block 29, which determines, before injecting the fuel, the hydraulic supply time $T_{HYD}$ as a function of the target quantity $Q_{INJ-OBJ}$ of fuel to inject and by using the first injection law IL1, which provides the hydraulic supply time $T_{HYD}$ as a function of the target quantity of fuel $Q_{INJ-OBJ}$.

The hydraulic supply time $T_{HYD}$ is communicated to a calculation block 30 which determines, before injecting the fuel, the closing time $T_{C\_EXT}$ estimated as a function of the hydraulic supply time $T_{HYD}$ and using the second injection law IL2, which provides the closing time $T_{C\_EXT}$ estimated as a function of the hydraulic supply time $T_{HYD}$.

A subtractor block 31 determines the injection time $T_{INJ}$ (i.e. the time interval elapsing between the starting time $t_1$ of injection and the ending time $t_2$ of injection) as a function of the hydraulic supply time $T_{HYD}$ and of the estimated closing time $T_{C\_EXT}$. In particular, the subtractor block 31 calculates the injection time $T_{INJ}$ by subtracting the estimated closing time $T_{C\_EXT}$ from the hydraulic supply time $T_{HYD}$.

The injector 4 is piloted using the injection time $T_{INJ}$ which establishes the duration of the time interval which elapses between the starting time $t_1$ of injection and the ending time $t_2$ of injection. After ending time $t_2$ of injection, a calculation block 30 measures the trend over time of the voltage v(t) across the coil 16 of the electromagnetic actuator 14 after annulment of the electric current i(t) which flows through the coil 16 until the voltage v(t) itself is annulled. The trend over time of the voltage v(t) across the coil 16 is processed by the calculation block 30 according to the processing method described above to determine the closing time $T_C$ as a function of the closing time $t_3$ of the injector 4 after executing the fuel injection.

The actual closing time $T_{C\text{-}REAL}$ of the injector 4 determined by the calculation block 32 is communicated to the calculation block 30, which uses the actual closing time $T_{C\text{-}REAL}$ to update the second injection law IL2 after injecting the fuel. Preferably, if the absolute value of the difference between the actual closing time $T_{C\text{-}REAL}$ and the corresponding estimated closing time $T_{C\_EXT}$ is lower than an acceptability threshold, then the actual closing time $T_{C\text{-}REAL}$ is used to update the second injection law IL2. Otherwise the actual closing time $T_{C\text{-}REAL}$ is considered wrong (i.e. it is assumed that unexpected accidental errors occurred during the identification process of the closing time $t_3$ and that consequently the actual closing time $T_{C\text{-}REAL}$ is not reliable). Obviously, the actual closing time $T_{C\text{-}REAL}$ is used to update the second injection law IL2 by means of statistic criteria which takes the "history" of the second law IL2 of injection into account. In this manner, it is possible to increase accuracy of the second law IL2 of injection over time (also by taking the time creep into account) so as to minimize the error which is committed during injection, i.e. so as to minimize the deviation between actual closing time $T_{C\text{-}REAL}$ and the corresponding estimated closing time $T_{C\_EXT}$.

According to one embodiment, the two laws IL1 and IL2 of injection depend on an injected fuel pressure $P_{rail}$. In other words, the laws IL1 and IL2 of injection vary as a function of the injected fuel pressure $P_{rail}$. Consequently, the hydraulic supply time $T_{HYD}$ is determined, using the first law IL1 of injection, as a function of the target quantity $Q_{INJ\text{-}OBJ}$ of fuel to inject and the injected fuel pressure $P_{rail}$. Furthermore, the estimated closing time $T_{C\_EXT}$ is determined using the second law IL2 of injection, as a function of the hydraulic supply time $T_{HYD}$ and the pressure of the injected fuel $P_{rail}$.

According to one embodiment, the first law IL1 of injection is a linear law which establishes a direct proportion between the target quantity of fuel $Q_{INJ\text{-}OBJ}$ and the hydraulic supply time $T_{HYD}$. In other words, the first law IL1 of injection is provided by the following linear equation:

$$Q_{INJ\text{-}OBJ}=A(P_{rail})*T_{HYD}+B(P_{rail}) \quad \text{[IL1]}$$

where:

$Q_{INJ\text{-}OBJ}$ is the target quantity of fuel;

$T_{HYD}$ is the hydraulic supply time;

A-B are numeric parameters determined experimentally and depending on the injected fuel pressure $P_{rail}$; and $P_{rail}$ is the fuel pressure which is injected.

It is worth noting that modeling the first law IL1 of injection by means of a linear equation allows an extreme simplification in determining the hydraulic supply time $T_{HYD}$ while guaranteeing very high accuracy at the same time.

According to one embodiment, when several injectors 4 of a same internal combustion engine 2 are present (as shown in FIG. 1), the first law IL1 of injection is in common to all injectors 4, while a corresponding second law IL2 of injection, potentially different from the second laws IL2 of injection of the other injectors 4, is present for each injector 4. In other words, the first law IL1 of injection is in common to all injectors 4 and, after having been experimentally determined during the step of designing, it is no longer varied (updated), because it is substantially insensitive to constructive dispersions of the injectors 4 and to the time creep of the injectors 4. Instead, each injector 4 has its own second law IL2 of injection, which is initially identical to the second laws IL2 of injection of the other injectors 4, but which over time evolves by effect of the updates carried out by means of the actual closing time $T_{C\text{-}REAL}$, and thus gradually differs from the second laws IL2 of injection of the other injectors 4 for tracking the actual features and time creep of its injector 4.

It is worth noting that the method described above for determining the closing time $t_3$ of the injector 4 is valid in any condition of operation of the injector 4, i.e. both when the injector 4 is operating in ballistic zone B, in which in the ending time $t_2$ of the injection the pin 23 has not yet reached the complete opening position of the injection valve 15, and when the injector 4 is operating in linear zone C, in which in the ending time $t_2$ of injection the pin 23 reaches the complete opening position of the injection valve 15. The difference is that in ballistic zone B the closing time $T_C$ is variable, while in linear zone C the closing time $T_C$ is substantially constant. Actually, the closing time $T_C$ varies slightly also in linear zone C: the variation of the closing time $T_C$ in linear zone C is lower than the variation of closing time $T_C$ in ballistic zone B, and tends to be a constant value as the injection time $T_{INJ}$ increases.

The method described above to determine the closing time of an electromagnetic fuel injector has many advantages.

Firstly, the above described method for determining the closing time of an electromagnetic fuel injector allows the closing time of an electromagnetic fuel injector to be identified with high accuracy. As described above, knowing the actual closing time of an electromagnetic injector is very important when the injector is used to inject small quantities of fuel because it allows the accurate estimate of the actual quantity of fuel which was injected by the injector at each injection. In this manner, it is possible to use an electromagnetic fuel injector also in ballistic zone to inject very small quantities of fuel (in the order of 1 milligram), thereby guaranteeing an adequate injection accuracy at the same time. It is worth noting that injection accuracy of very small quantities of fuel is not reached by reducing the dispersion of injector features (an extremely complex, costly operation), but is reached with the possibility of immediately correcting deviations with respect to the optimal condition by exploiting the knowledge of the actual quantity of fuel which was injected by the injector at each injection (actual quantity of fuel which was injected, which is estimated by knowing the actual closing time).

Furthermore, the above described method for determining the closing time of an electromagnetic fuel injector is simple and cost-effective and may be employed in an existing electronic control unit because no additional hardware is needed with respect to that normally present in the fuel injection systems. Moreover, high calculation power is not needed, and nor is a large memory capacity required to employ the method of the present invention.

The invention has been described in an illustrative manner. It is to be understood that the terminology which has been used is intended to be in the nature of words of description rather than of limitation. Many modifications and variations of the invention are possible in light of the above teachings. Therefore, the invention may be practiced other than as specifically described.

What is claimed is:

1. A method for determining the closing time ($t_3$) of an electromagnetic fuel injector (4), having a pin (23) movable between a closed position and an open position of an injection valve (15), and an electromagnetic actuator (14) equipped with a coil (16) and adapted to determine the displacement of the pin (23) between the closed position and the open position; the method including the steps of:

applying at a starting time ($t_1$) of the injection a positive voltage (v) to the coil (16) of the electromagnetic actuator (14) in order to circulate through the coil (16) an electric current (i) which causes the opening of the injection valve (15);

applying at an ending time ($t_2$) of the injection a negative voltage (v) to the coil (16) of the electromagnetic actuator (14) in order to annul the electric current (i) flowing through the coil (16);

detecting the trend over time of the voltage (v) across the coil (16) of the electromagnetic actuator (14) when the voltage (v) is negative, after the annulment of the electric current (i) flowing through the coil (16) and until the annulment of the voltage (v);

identifying a perturbation (P) of the voltage (v) across the coil (16) after the annulment of the electric current (i) flowing through the coil (16) by calculating the first derivative in time of the voltage (v) across the coil (16) after the annulment of the electric current (i) flowing through the coil (16); and recognizing the closing time ($t_3$) of the injector (4) that coincides with the time ($t_3$) of the perturbation (P) of the voltage (v) across the coil (16) after the annulment of the electric current (i) flowing through the coil (16);

where the steps of identifying the perturbation (P) of the voltage (v) across the coil 16) further includes the steps of:

calculating an absolute value of the first derivative in time of the voltage (v) across the coil (16);

calculating an integral over time of the absolute value of the first derivative in time of the voltage (v) across the coil (16); and identifying the perturbation (P) when the absolute value of the integral over time of the first derivative in time of the voltage (v) across the coil (16) exceeds a second threshold value (S2).

2. The method as set forth in claim 1, wherein at the ending time ($t_2$) of the injection the pin (23) has not yet reached a position of complete opening of the injection valve (15) and therefore the fuel injection occurs in the “ballistic zone”.

3. The method as set forth in claim 1, wherein the perturbation (P) of the voltage (v) across the coil (16) consists of a high frequency oscillation of the voltage (v) across the coil (16).

4. The method as set forth in claim 1, wherein the perturbation (P) of the voltage (v) across the coil (16) consists of an oscillation of the voltage (v) across the coil (16) having a frequency of about 70 kHz.

5. The method as set forth in claim 1, wherein the step of identifying the perturbation (P) of the voltage (v) across the coil (16) further includes the step of filtering the first derivative in time of the voltage (v) across the coil (16) by using a band-pass filter consisting of a low-pass filter and a high-pass filter.

6. The method as set forth in claim 5, wherein the band-pass filter has a bandwidth between 60 and 110 kHz.

7. The method as set forth in claim 1. wherein the step of identifying the perturbation (P) of the voltage (v) across the coil (16) further includes the step of applying preventively a moving average to the absolute value of the first derivative in time of the voltage (v) across the coil (16) before identifying the perturbation (P).

8. The method as set forth in claim 1, wherein the step of identifying the perturbation (P) of voltage (v) across the coil (16) further includes the step of normalizing the absolute value of the first derivative in time of the voltage (v) across the coil (16) before identifying the perturbation (P) such that after normalization the absolute value of first derivative in time of the voltage (v) across the coil (16) varies over a predefined standard interval.

9. The method as set forth in claim 1 further including the step of applying at the time ($t_3$) of the perturbation (P) a predefined advance time to compensate the phase delay introduced by all filtering processes applied to the voltage (v) across the coil (16) for the purpose of identifying the perturbation (P) of voltage (v) across the coil (16).

10. A method for determining the closing time ($t_3$) of an electromagnetic fuel injector (4), having a pin (23) movable between a closed position and an open position of an injection valve (15), and an electromagnetic actuator (14) equipped with a coil (16) and adapted to determine the displacement of the pin (23) between the dosed position and the open position; the method including the steps of:

applying, at a starting time ($t_1$) of the injection a positive voltage (v) to the coil (16) of the electromagnetic actuator (14) in order to circulate through the coil (16) an electric current (i) which causes the opening of the injection valve (15);

applying, at an ending time ($t_2$) of the injection a negative voltage (v) to the coil (16) of the electromagnetic actuator (14) in order to annul the electric current (i) flowing through the coil (16);

detecting the trend over time of the voltage (v) across the coil (16) of the electromagnetic actuator (14) when the voltage (v) is negative, after the annulment of the electric current (i) flowing through the coil (16) and until the annulment of the voltage (v);

identifying a perturbation (P) of the voltage (v) across the coil (16) after the annulment of the electric current (i) flowing through the coil (16);

recognizing the closing time ($t_3$) of the injector (4) that coincides with the time ($t_3$) of the perturbation (P) of the voltage (v) across the coil (16) after the annulment of the electric current (i) flowing through the coil (16);

applying filtering processes to the voltage (v) across the coil (16); and applying at the time ($t_3$) of the perturbation (P) a predefined advance time to compensate the phase delay introduced by all filtering processes applied to the voltage (v) across the coil (16) for the purpose of identifying the perturbation (P) of voltage (v) across the coil (16).

* * * * *

UNITED STATES PATENT AND TRADEMARK OFFICE

CERTIFICATE OF CORRECTION

PATENT NO. : 8,571,821 B2
APPLICATION NO. : 13/081784
DATED : October 29, 2013
INVENTOR(S) : Serra et al.

It is certified that error appears in the above-identified patent and that said Letters Patent is hereby corrected as shown below:

In the Claims:

Column 11, line 55 delete "." and insert therefor --,--.

Column 12, line 25 delete "dosed" and insert therefor --closed--.

Column 12, line 27 delete ",".

Column 12, line 32 delete ",".

Signed and Sealed this
Thirty-first Day of December, 2013

Margaret A. Focarino

Margaret A. Focarino
*Commissioner for Patents of the United States Patent and Trademark Office*